US012719258B2

(12) United States Patent
Konash et al.

(10) Patent No.: US 12,719,258 B2
(45) Date of Patent: Aug. 25, 2026

(54) ELECTRICAL ARC-FLASH PROTECTION BASED ON PERSONNEL PROXIMITY SENSING

(71) Applicant: SAUDI ARABIAN OIL COMPANY, Dhahran (SA)

(72) Inventors: Omar F. Konash, Dhahran (SA); Bader S. Khaldi, Dhahran (SA); Eyhab Adel Mohammed Wazirali, Dammam (SA); Majed M. Hamrani, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 522 days.

(21) Appl. No.: 18/059,883

(22) Filed: Nov. 29, 2022

(65) Prior Publication Data

US 2024/0178647 A1 May 30, 2024

(51) Int. Cl.

*H02H 3/08* (2006.01)
*G01R 31/12* (2020.01)
*H02H 1/00* (2006.01)
*H02H 9/02* (2006.01)

(52) U.S. Cl.

CPC ............... *H02H 3/08* (2013.01); *G01R 31/12* (2013.01); *H02H 1/0092* (2013.01)

(58) Field of Classification Search

CPC .......... H02H 3/08; H02H 3/04; H02H 1/0092; G01R 31/12
USPC .................................................. 361/42, 93.1
See application file for complete search history.

(56) References Cited

U.S. PATENT DOCUMENTS 5,596,473 A * 1/1997 Johnson ................. H02H 3/044 361/64
8,649,139 B2 2/2014 Roscoe et al.
11,050,237 B2 6/2021 Takemura et al.
2006/0114630 A1 6/2006 Culligan et al.
2008/0142486 A1 6/2008 Vicente et al.
2008/0204947 A1 8/2008 Shea et al.
(Continued)

FOREIGN PATENT DOCUMENTS

KR 101332672 B1 11/2013

OTHER PUBLICATIONS

International Search Report issued for corresponding international patent application No. PCT/US2023/081351, mailed Apr. 3, 2024 (5 pages).

(Continued)

*Primary Examiner* — Crystal L Hammond
*Assistant Examiner* — Lucy M Thomas
(74) *Attorney, Agent, or Firm* — Osha Bergman Watanabe & Burton LLP

(57) ABSTRACT

A system includes a plurality of sensors, a processor, and a notification system. The plurality of sensors detects personnel within a proximity from an electrical equipment. The processor obtains data from the electrical equipment and the detection from the plurality of sensors; calculates safety parameters based on the data and the detection; and controls one or more Overcurrent Protective Devices (OCPDs), dynamically and without human intervention, by changing a plurality of relay settings based on the safety parameters. The notification system obtains information comprising the control and safety parameters from the processor and notifies the information to related personnel.

16 Claims, 3 Drawing Sheets

(56) References Cited

U.S. PATENT DOCUMENTS

| | | | | |
|---|---|---|---|---|
| 2010/0133922 | A1 | 6/2010 | Payack | |
| 2017/0004948 | A1 * | 1/2017 | Leyh | H01H 9/547 |
| 2020/0247365 | A1 * | 8/2020 | Safir | B60R 25/31 |

OTHER PUBLICATIONS

Written Opinion issued for corresponding international patent application No. PCT/US2023/081351, mailed Apr. 3, 2024 (9 pages).
Eaton "Arcflash Reduction Maintenance Switch Application and Installation"; Cutler-Hammer (20 pages).
Ken Box, P.E., "NEC 2047: Arc Energy Reduction Aricle 240.87"; GE Industrial (28 pages).
ABB "Arc flash energy reduction using ABB Emax 2 with second I Protection (21) and Dual Settings" (28 pages).
GE Industrial "Zone-Selective Interlocking For ABB Circuit Breaker and Power Switch Trip Units"; DET1001 Application and Technical Guide (20 pages).

* cited by examiner

ELECTRICAL ARC-FLASH PROTECTION BASED ON PERSONNEL PROXIMITY SENSING

BACKGROUND

An arc flash is a type of electrical explosion or discharge that results from a connection through air to ground or another voltage phase in an electrical system. In arc flash events, large amount of energy is released between two live conductors, causing powerful blast and massive pressure waves. As a result, overcurrent protection is critical to personal safety and protection from the hazardous arc flash events. However, in traditional systems and methods, Overcurrent Protective Devices (OCPD), commonly called circuit breakers, take relatively long time to clear faults resulting into significant and dangerous release of energy should a fault take place in the distribution equipment. Therefore, a system that triggers the OCPDs to clear the fault as fast as possible is needed.

SUMMARY

In one aspect, the disclosure relates to a system. The system includes a plurality of sensors, a processor, and a notification system. The plurality of sensors detects personnel within a proximity from an electrical equipment. The processor obtains data from the electrical equipment and the detection from the plurality of sensors; calculates safety parameters based on the data and the detection; and controls one or more OCPDs, dynamically and without human intervention, by changing a plurality of relay settings based on the safety parameters. The notification system obtains information that including the control and safety parameters from the processor and notifies the information to related personnel.

In another aspect, the disclosure relates to a method. The method includes detecting, by a plurality of sensors, personnel within a proximity from an electrical equipment; obtaining, by a processor, data from the electrical equipment and the detection from the plurality of sensors; calculating, by the processor, safety parameters based on the data and the detection; controlling, by the processor, one or more OCPDs, dynamically and without human intervention, by changing a plurality of relay settings based on the safety parameters; and notifying, by a notification system, the control and safety parameters to related personnel.

Other aspects and advantages of the invention will be apparent from the following description and the appended claims.

DETAILED DESCRIPTION

Figure 1:
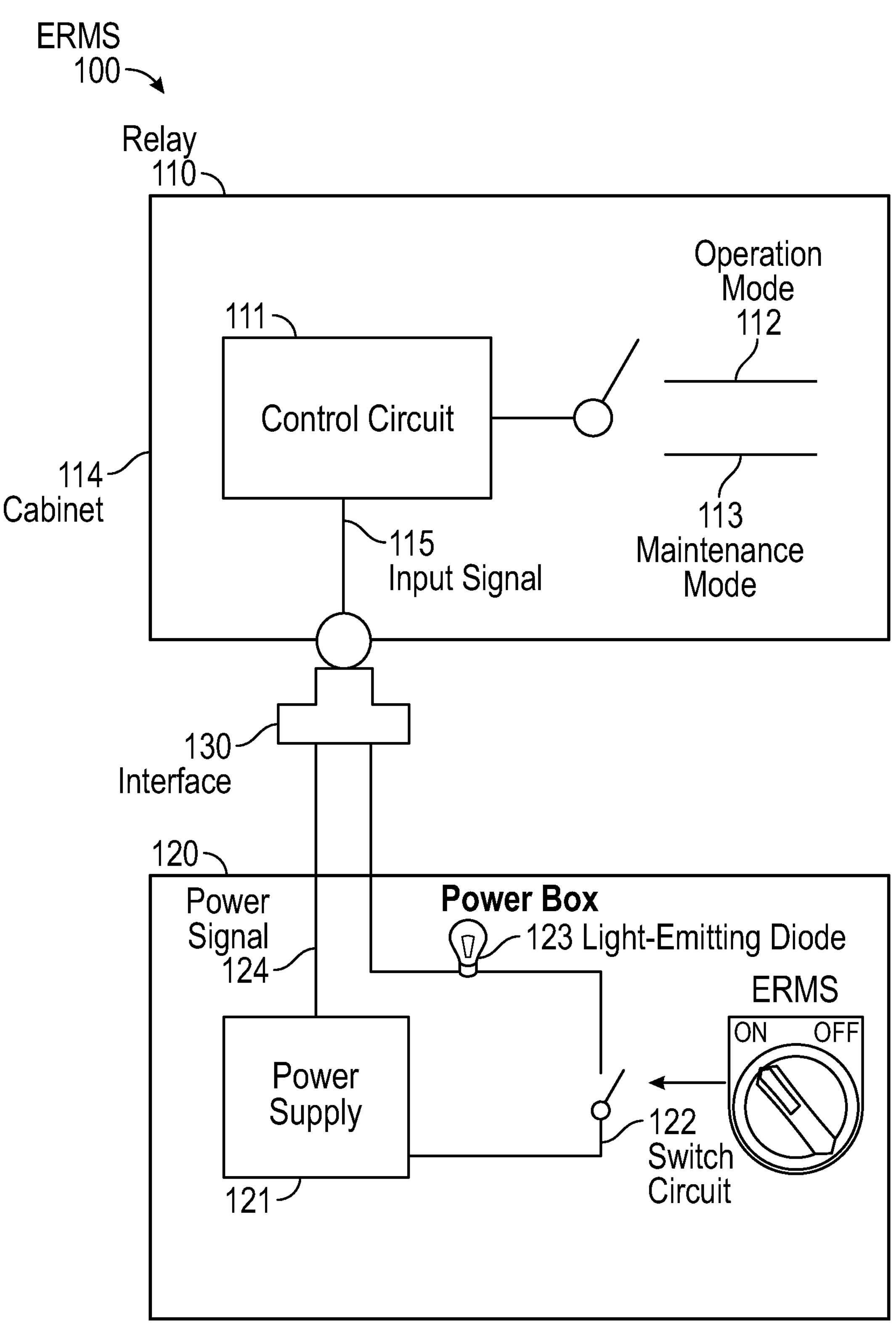
FIG. 1 is a schematic diagram of an OCPD device according to one or more embodiments.

Specific embodiments of the invention will now be described in detail with reference to the accompanying figures. Like elements in the various figures are denoted by like reference numerals for consistency. Like elements may not be labeled in all figures for the sake of simplicity.

In the following detailed description of embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that, one or more of the steps shown in the flowcharts may be omitted, repeated, and/or performed in a different order than the order shown. Accordingly, the scope of the invention should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

As mentioned above, in traditional systems and methods, the OCPDs take relatively long time to clear faults resulting into significant and dangerous release of energy should a fault take place in the distribution equipment. The release of energy associated with faults is a hazard and defined as arc flash hazard and it is one of the challenging safety issues in the utility and industry applications.

If the OCPD is triggered to clear the faults faster, the incident energy associated with the arc flash will be reduced in direct relation. Fault clearing time can be made shorter if settings of the protective relay or trip unit which is part of the OCPD is adjusted to minimum time delay or with no delay.

Accordingly, this disclosure is based on triggering the OCPD to act instantaneously or at the fastest possible mode whenever personnel are available at given proximity from the electrical equipment. Personnel can be identified so that the system can react to specific category of people differently. Proximity sensors specially designed to cover the space around the equipment are selected to activate the protection system and change the response time and fault clearing time from normal mode to fast clearing or instantaneous mode of protection.

FIG. 1 is a schematic diagram of an OCPD. An OCPD is a piece of equipment used in electrical systems that are at risk of experiencing overcurrent due to overloads, short circuits, or ground faults. An overcurrent is any situation in which the amount of current (amperes) in a system (e.g., an electrical circuit) exceeds the amount of current that the system is designed to safely handle. In overcurrent situations, an OCPD will interrupt current flowing through the system to make it safe.

In one or more embodiments, the OCPD devices may comprise fuses, circuit breakers, and overcurrent relays. In cases where an overcurrent occurs, these devices will break the circuit through which the current is flowing. OCPDs only work in relation to the amount of current flowing through them and will therefore not respond to an overcurrent flowing through another part of the circuit.

In the embodiments of FIG. 1, the OCPD may include an Energy Reduction Maintenance Settings (ERMS) system. The ERMS system may be used to reduce protection settings so that the circuit breaker trips as soon as possible when an arc fault occurs. Minimizing the time between fault and trip helps to reduce the risk of injury when qualified electrical personnel are near electrical equipment.

In the embodiments of FIG. 1, the ERMS system 100 includes a relay 110, a power box 120 outputting a power signal 124, and an electrical interface 130 connecting the power supply 121 to the relay 110. The portable power box 120 may include a switch circuit 122 and a light-emitting diode 123. The relay 110 is designed to protect circuits from electrical faults.

According to one or more embodiments, the relay 110 includes a control circuit 111 that, based on an input signal 115, controls the relay 110 to operate under different modes. These modes may include an "Operation" mode 112 and a "Maintenance" mode 113. The "Operation" mode may also be referred to as "Normal" mode, where the relay 110 provides protection to the protected circuit in regular operations. The "Maintenance" mode, on the other hand, is designed when maintenance (e.g., inspection, upgrade, or repair) is performed on the protected circuit. Under "Maintenance" mode, the relay 110 is specifically configured to maintain a lower and safer maximum value of energy released in case of an arc flash event, thereby improving the safety of maintenance personnel and equipment.

The control circuit 111 may be pre-configured with fixed parameters. Alternatively, the control circuit 111 may include programmable logic that enables customization with different configurations when the relay 110 is installed in different environments. The programmable logic can be programed through a communication port on the relay 110 using a computer or through a front pad in the relay 110.

In some embodiments, the control circuit 111 may include basic circuit elements, such as logic gates, ports and wires, and timers, which form configurable blocks to activate different setting groups based on the status of the input signal 115. The control circuit 111 thus may enable or block overcurrent protection elements under different operation modes. The detailed implementation of the control circuit 111 is within the knowledge of one of ordinarily skill in the art.

In one or more embodiments, the relay 110 may be disposed in a cabinet 114 that encloses either a part or the entirety of the body of the relay. The cabinet 114 may include a control panel that allows an operator to check the status of the relay 110 and configure the control circuit 111.

In the above embodiments, the one or more OCPDs may include additional components such as the ERMS system 100. In one or more embodiments, the one or more OCPDs may include fuses for overcurrent protection.

Figure 2:
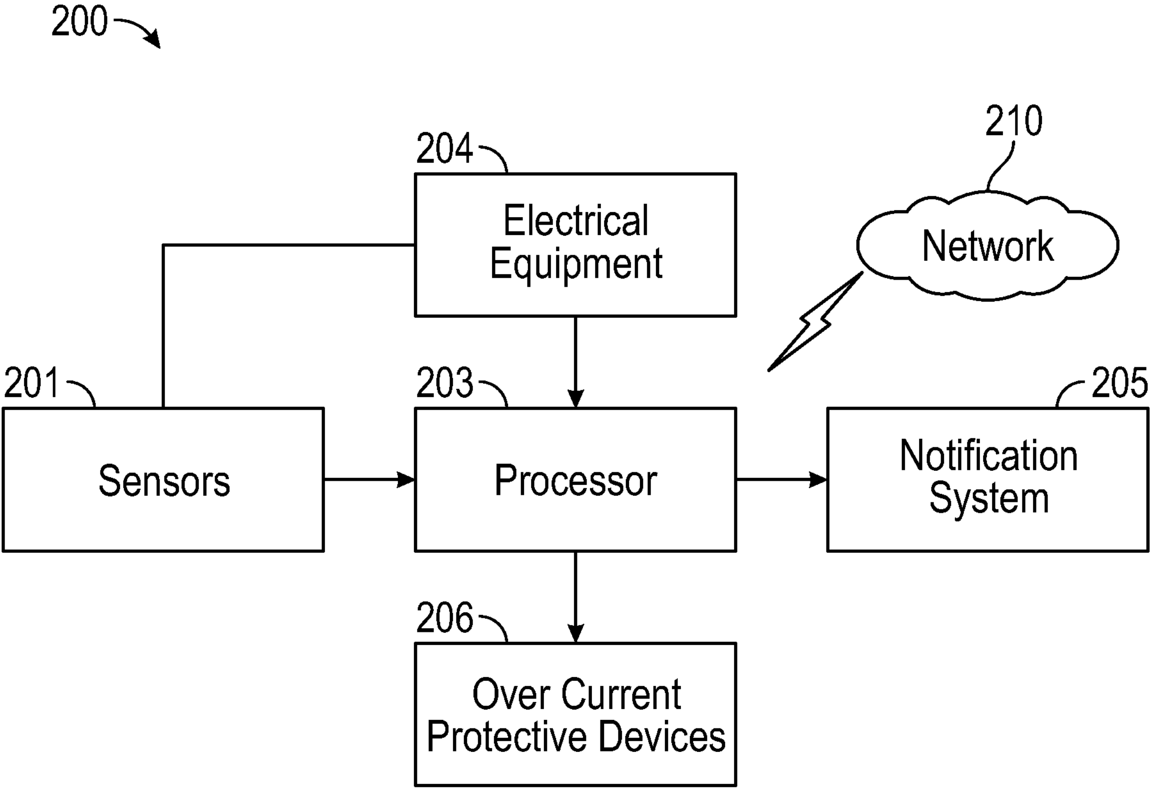
FIG. 2 is a schematic diagram of a system according to one or more embodiments.

FIG. 2 is a schematic diagram of a system 200. The system 200 includes a plurality of sensors 201, a processor 203, and a notification system 205. The system 200 may further include an electrical equipment 204 and one or more OCPDs 206. The one or more OCPDs 206 may be controlled through a network 210.

In one or more embodiments, the sensors 201 may include one or more proximity sensors. In one or more embodiments, the one or more proximity sensors detects a presence of nearby personnel without any physical contact. In one or more embodiments, the one or more proximity sensors may emit an electromagnetic field or a beam of electromagnetic radiation (infrared, for instance), and detect for changes in the field or return signals. Proximity sensors are specially designed to cover the space around the electrical equipment 204 and detect proximity of personnel. Taking the electrical equipment as a center, the proximity sensors preferably cover at least a circle with a radius equal or greater than the arc flash protection boundary as defined in the safety standards, in view of preventing fatal burn from potential electric arcs.

In one or more embodiments, the one or more proximity sensors may include, for example, passive infrared sensors, capacitive sensors, Doppler effect sensors, inductive sensors, magnetic sensors, optical sensors, photoelectric sensors, sonar sensors, fiber optics sensors, and Hall sensors. Other physical positioning technologies include predetermined 3D space based positioning, and pressure sensors.

In one or more embodiments, the proximity sensors may be selected to trigger the processor 203 to activate the one or more OCPD 206 and change the response time and fault clearing time from normal mode to fast clearing or instantaneous mode of protection. The new fault clearing time is determined based on real-time power system analysis and active feedback on the actual status of system topology. The fault clearing time refers to the total time between the beginning of a specified overcurrent and the final interruption of the circuit (for example, interrupted by the OCPD) at rated voltage.

In one or more embodiments, the processor 203 may further include an operational module that identifies roles and responsibilities of the personnel, and which equipment is intended for the job. This can be achieved via various options including operational module of the Enterprise Resource Program (ERP), ID based recognition, fingerprints, card reading, and facial recognition means.

In one or more embodiments, the system 200 may react to specific categories of the personnel differently. For example, the processor 203 may receive the detection data from the sensors 201, and if the detected personnel is not authorized to work on the equipment, or if the detected personnel is not wearing personal protective equipment, the processor 203 may instruct the notification system 205 to display warnings and log the event.

Turning to the processor 203, the processor 203 obtains data from the electrical equipment and the detection from the plurality of sensors 201; calculates safety parameters based on the data and the detection; and controls the one or more OCPDs 206, dynamically and without human intervention, by changing a plurality of relay settings based on the safety parameters.

In one or more embodiments, the processor 203 obtains the detection from the sensors 201. The detection may include, for example, proximity, motion speed, height, roles, and responsibilities of the detected personnel. In one or more embodiments, the processor 203 may control the one or more OCPDs 206 without human intervention based on the proximity of the detected personnel and change the response time and fault clearing time from normal mode to fast clearing or instantaneous mode of protection. In one or more embodiments, the processor 203 may include an interlock logic module to enable or disable equipment operations based on proximity of the detected personnel. One example is to disable rack-in or rack-out of withdrawable electrical gears if the detected personnel are within specific distance from the gear enforcing certain safety requirement. Another example is to use it as confirmation or validation measure to prevent human prone errors related to operating a wrong device or equipment.

In one or more embodiments, the processor 203 may also obtain real-time data from the electrical equipment 204. The real-time data may include data from the one or more OCPDs 206, such as fault clearing time, short circuit current, relay or trip unit settings, operation status of electrical machines, status of bus-tie breakers, and status of major loads which have effect on available short circuit contribution. The real-time data may further include other inputs necessary to calculate key safety parameters such as arcing current, arc duration, incident energy, arc-flash boundary, energy levels, and types of protective gears. The processor 203 may then calculate the above key safety parameters based on the equations provided in NFPA 70E and IEEE 1584. By way of these calculations, the processor 203 performs risk assessment/analysis and associated calculation based on real-time and dynamic acquisition of input data that measures the actual condition and status of operation of the equipment, instead of depending on traditional predetermined and desk-top calculations.

Based on the above key safety parameters, the processor 203 may control and change the one or more OCPDs 206. Specifically, the processor 203 may change the characteristics of protection such as changing relay or trip unit settings of the one or more OCPDs 206 to reduce arc flash hazard. This is dynamic control with active feedback (close loop) supervising system. In one or more embodiments, the processor 203 may be configured to obtain the data and performs the arc flash risk assessment after each operation of the electrical equipment 204 (i.e. real-time supervisory system 200).

In one or more embodiments, the sensors 201 may perform systematic supervision instead of local detection. By performing systematic supervision, the processor 203 may remotely control the one or more OCPDs 206 based on the obtained real-time data. In one or more embodiments, the processor 203 may globally supervise and control a plurality of systems 200. In one or more embodiments, the processor 203 may use group setting control based on network 210 to control remote one or more OCPDs 206. In one or more embodiments, the system may reach out to the remote or upstream power supply to cover all possible fault scenarios such as detecting current system topology and change of setting include protective devices upstream of the line side of the equipment.

In one or more embodiments, the processor 203 may transmit information including the above control and changes made to the one or more OCPDs 206, the assessment results, and the above key safety parameters, to the notification system 205.

Turning to the notification system 205, the notification system 205 may be, or notify through, screens, goggles, holograms, terminals, alarms, notification LEDs, and other audio or vision means. A terminal may be a device which ends a telecommunications link and is the point at which a signal enters or leaves a network, and may include smart phones, computers, etc.

In one or more embodiments, the notification system 205 may notify by generating a remote alarm sound or texts on mobile phones to interact with related personnel or authorized operators when personnel are detected at given proximity to the electrical equipment.

In one or more embodiments, the notification system 205 may notify the personnel with an interactive presentation. With the interactive presentation of the above assessment results, and key safety parameters, the technician may know for example, the energy level associated with the distance and alert the technician in case PPE was not present or adequate.

Figure 3:
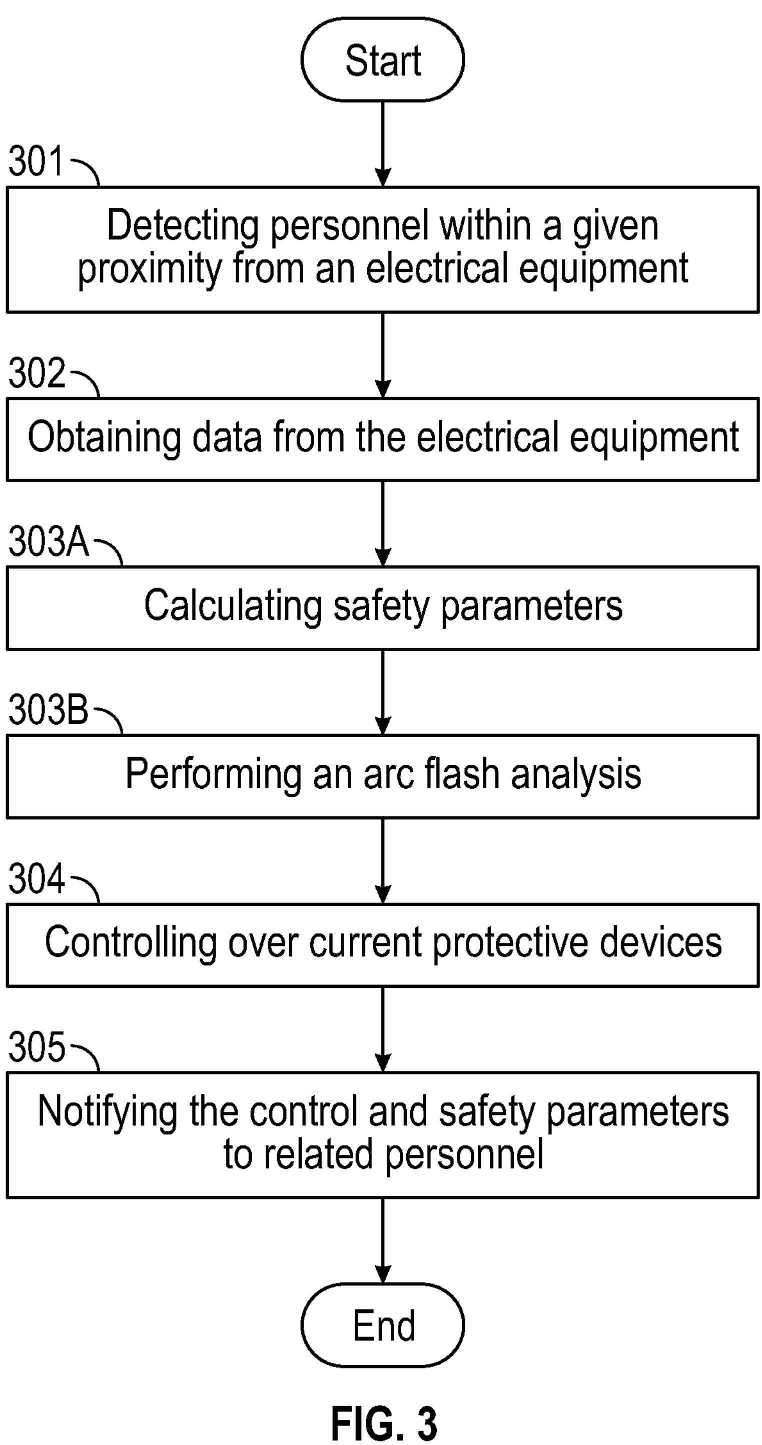
FIG. 3 is a flowchart of a method according to one or more embodiments.

FIG. 3 is a flowchart showing a method for implementing an system according to one or more embodiments. The settings and configurations for performing the steps of the method may be similar to those of the system described with reference to FIGS. 1 and 2. It is noted that not all of steps 301-305 are required in all embodiments.

Step 301 includes detecting, by a plurality of sensors, personnel within a proximity from an electrical equipment.

Step 302 includes obtaining, by a processor, data from the electrical equipment and the detection from the plurality of sensors.

Step 303A includes calculating, by the processor, safety parameters based on the data and the detection.

Step 303B includes performing, by the processor, an arc flash analysis based on the data and the safety parameters every time an operation is conducted by the electrical equipment.

Step 304 includes controlling, by the processor, one or more Overcurrent Protective Devices (OCPDs), dynamically and without human intervention, by changing a plurality of relay settings based on the safety parameters.

Step 305 includes notifying, by a notification system, the control and safety parameters to related personnel. Logging activities of processor, using time-stamped (data historian), and, possibly, as part of the lock-out Tag-out (LOTO) operational requirements.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system comprising:

a plurality of sensors that detects personnel within a proximity from an electrical equipment;

a processor that:

obtains data from the electrical equipment and the detection from the plurality of sensors;

calculates safety parameters that include arcing current, arc duration, incident energy, and an arc-flash boundary, based on the data and the detection, wherein the processor uses real-time data from the electrical equipment and the detection from the sensors, and the safety parameters are obtained from actual operating conditions; and controls one or more Overcurrent Protective Devices (OCPDs), dynamically and without human intervention, by changing a plurality of relay settings based on the safety parameters; and a notification system that obtains information comprising the control and safety parameters from the processor and notifies the information to related personnel, wherein the control is performed remotely over a network, using group setting control to coordinate adjustments across multiple systems, including reaching out to remote or upstream power supplies to adapt relay settings based on current system topology and fault scenarios, wherein the real-time data obtained by the processor includes status of bus-tie breakers and major loads that affect available short-circuit contribution, and the processor adjusts relay settings based thereon.

2. The system of claim 1, wherein the plurality of sensors further detects roles and responsibilities of the personnel within the proximity from the electrical equipment.

3. The system of claim 2, wherein the plurality of sensors detects roles and responsibilities of personnel by using one or more methods of facial recognition, fingerprinting, Enterprise Resource Program (ERP), and card reading.

4. The system of claim 2, wherein the system reacts based on the roles and responsibilities of the personnel.

5. The system of claim 1, wherein the processor controls, by using interlock logic, operations of the electrical equipment based on a detected proximity of the personnel.

6. The system of claim 1, wherein the data comprises fault clearing time and available short circuit current.

7. The system of claim 6, wherein the fault clearing time is determined based on a real-time power system analysis and an active feedback on an actual status of system topology.

8. The system of claim 1, wherein the processor controls the one or more OCPDs to act instantaneously when the personnel are within the proximity from the electrical equipment.

9. The system of claim 1, wherein the processor performs an arc flash analysis every time an operation is conducted by the electrical equipment.

10. The system of claim 1, wherein the notification system notifies the control and safety parameters to related personnel through a terminal.

11. The system of claim 1, wherein the processor controls the one or more OCPDs remotely through network based control.

12. A method comprising:

detecting, by a plurality of sensors, personnel within a proximity from an electrical equipment;

obtaining, by a processor, data from the electrical equipment and the detection from the plurality of sensors;

calculating, by the processor, safety parameters that include arcing current, arc duration, incident energy, and an arc-flash boundary, based on the data and the detection, wherein the processor uses real-time data from the electrical equipment and the detection from the sensors, and the safety parameters are obtained from actual operating conditions;

controlling, by the processor, one or more Overcurrent Protective Devices (OCPDs), dynamically and without human intervention, by changing a plurality of relay settings based on the safety parameters; and notifying, by a notification system, the control and safety parameters to related personnel, wherein the control is performed remotely over a network, using group setting control to coordinate adjustments across multiple systems, including reaching out to remote or upstream power supplies to adapt relay settings based on current system topology and fault scenarios, wherein the real-time data obtained by the processor includes status of bus-tie breakers and major loads that affect available short-circuit contribution, and the processor adjusts relay settings based thereon.

13. The method of claim 12, wherein the method further includes performing an arc flash analysis every time an operation is conducted by the electrical equipment.

14. The system of claim 1, wherein when the detected personnel is determined to be unauthorized to work on the electrical equipment or determined to not be wearing personal protective equipment, the processor causes the notification system to output a warning.

15. The system of claim 1, wherein when the detected personnel is determined to be unauthorized to work on the electrical equipment, the processor causes the notification system to output a warning.

16. The system of claim 1, wherein when the detected personnel is determined to not be wearing personal protective equipment, the processor causes the notification system to output a warning.

* * * * *